United States Patent
Kano et al.

(10) Patent No.: US 10,861,941 B2
(45) Date of Patent: Dec. 8, 2020

(54) SEMICONDUCTOR DEVICE AND METHOD OF MANUFACTURING SEMICONDUCTOR DEVICE

(71) Applicant: KABUSHIKI KAISHA TOSHIBA, Tokyo (JP)

(72) Inventors: Akira Kano, Kanagawa (JP); Akihiro Goryu, Kanagawa (JP); Kenji Hirohata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/286,648

(22) Filed: Feb. 27, 2019

(65) Prior Publication Data

US 2020/0075733 A1 Mar. 5, 2020

(30) Foreign Application Priority Data

Aug. 31, 2018 (JP) .................. 2018-163358

(51) Int. Cl.
*H01L 29/16* (2006.01)
*H01L 29/70* (2006.01)
*H01L 21/02* (2006.01)

(52) U.S. Cl.
CPC .... *H01L 29/1608* (2013.01); *H01L 21/02378* (2013.01); *H01L 21/02433* (2013.01); *H01L 29/70* (2013.01)

(58) Field of Classification Search
CPC ......... H01L 21/02378; H01L 21/02433; H01L 29/1608; H01L 29/70

USPC ............................................................ 257/77
See application file for complete search history.

(56) References Cited

U.S. PATENT DOCUMENTS

| | | | | |
|---|---|---|---|---|
| 5,492,773 A | * | 2/1996 | Sekiya ............. | G11B 5/72 360/131 |
| 5,915,194 A | * | 6/1999 | Powell ............. | C30B 25/02 257/E21.125 |
| 6,488,771 B1 | * | 12/2002 | Powell ............. | C30B 25/02 117/84 |
| 2004/0144301 A1 | * | 7/2004 | Neudeck ......... | C30B 25/02 117/86 |
| 2016/0352075 A1 | * | 12/2016 | Iwami ............. | H01L 31/105 |
| 2017/0256647 A1 | | 9/2017 | Nakazawa et al. | |

FOREIGN PATENT DOCUMENTS

| | | |
|---|---|---|
| JP | 2010-103208 A | 5/2010 |
| JP | 2010103208 A * | 5/2010 |
| JP | 2018-6732 A | 1/2018 |
| JP | 2018-45486 A | 3/2018 |

* cited by examiner

*Primary Examiner* — Igwe U Anya
(74) *Attorney, Agent, or Firm* — Finnegan, Henderson, Farabow, Garrett & Dunner, L.L.P.

(57) ABSTRACT

According to an embodiment, in a semiconductor device, a total value of a change amount of chemical potential of the semiconductor device with respect to a expansion direction of a stacking fault and the stacking fault energy of the stacking fault is zero or more.

7 Claims, 15 Drawing Sheets

US 10,861,941 B2

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application No. 2018-163358, filed on Aug. 31, 2018; the entire contents of which are incorporated herein by reference.

FIELD

Embodiments described herein relate generally to a semiconductor device and a method of manufacturing a semiconductor device.

BACKGROUND

Hexagonal compound semiconductors have higher dielectric breakdown electric field strength than silicon (Si) and are semiconductors having excellent physical properties such as thermal conductivity, electron mobility, band gap, and the like, and therefore, such hexagonal compound semiconductors are expected as semiconductor materials capable of dramatically improving performance as compared with conventional Si-based semiconductor elements.

A silicon carbide (SiC)-based power semiconductor device using SiC as a semiconductor material exhibits better characteristics than an Si-based power semiconductor element using Si as semiconductor material. However, the conventional semiconductor devices have a problem that a crystal defect (basal plane dislocation or the like) present inside changes into a stacking fault due to current stress and characteristics deteriorate due to occurrence or expansion of the stacking fault.

DETAILED DESCRIPTION

According to an embodiment, in a semiconductor device, a total value of a change amount of chemical potential of the semiconductor device with respect to a expansion direction of a stacking fault and the stacking fault energy of the stacking fault is zero or more.

Hereinafter, a semiconductor device and a method of manufacturing a semiconductor device will be described in detail with reference to the accompanying drawings.

First Embodiment

Figure 1:
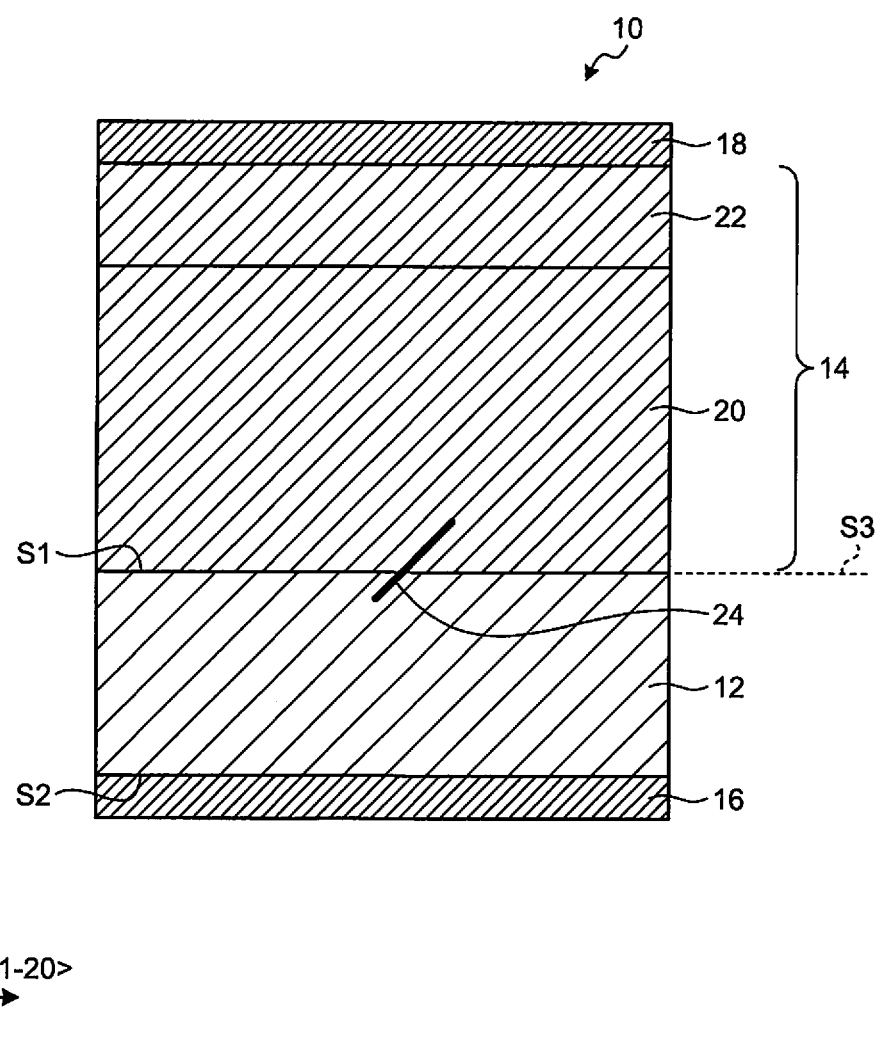
FIG. 1 is a schematic diagram of a semiconductor device.

FIG. 1 is a schematic diagram illustrating an example of a semiconductor device 10 according to the present embodiment.

In FIG. 1, the semiconductor device 10 having a bipolar type PN junction diode structure using silicon carbide (SiC) having a hexagonal structure as a semiconductor material is illustrated as an example.

In the following description, a plane perpendicular to a <0001> direction in a crystal orientation of an SiC crystal is called a (0001) plane, a plane perpendicular to a <11-20> direction is called a (11-20) plane, and a plane perpendicular to a <1-100> direction is called a (1-100) plane. Furthermore, the (0001) plane is also referred to as an Si plane or a basal plane, and a (000-1) plane is also referred to as a C plane.

Note that FIG. 1 is an example of a cross-sectional view of the semiconductor device 10 taken along a plane perpendicular to the (0001) plane of silicon carbide (SiC) having a hexagonal structure.

The semiconductor device 10 includes a support substrate 12, a semiconductor film 14, a lower electrode 16, and an upper electrode 18.

The semiconductor film 14 is provided on a first surface S1 of the support substrate 12. The lower electrode 16 is provided on a second surface S2 of the support substrate 12 that is opposite to the first surface S1. The upper electrode 18 is provided on a surface of the semiconductor film 14 that is opposite to a surface contacting the support substrate 12. That is, the semiconductor device 10 is a laminate in which the lower electrode 16, the support substrate 12, the semiconductor film 14, and the upper electrode 18 are stacked in this order.

The support substrate 12 is a substrate configured to support the semiconductor film 14. The support substrate 12 is, for example, an SiC substrate. Note that the support substrate 12 may be an N$^+$-type substrate doped with a donor such as phosphorus (P) and arsenic (As). A case where the support substrate 12 is an off-substrate in which a slice surface of the support substrate 12 has an off-angle in the <11-20> direction with respect to the (0001) plane will be described as an example.

The semiconductor film 14 is a film formed by epitaxially growing the semiconductor material on the support substrate 12. In the present embodiment, the semiconductor film 14 includes an N-type well layer 20 and a P$^+$-type ion implantation layer 22.

The N-type well layer 20 is an N-type SiC epitaxial layer. The P$^+$-type ion implantation layer 22 is an ion implantation layer into which an acceptor such as boron (B) and aluminum (Al) is injected. Note that the P$^+$-type ion implantation layer 22 may be a contact layer with respect to the upper electrode 18 or the like.

Note that it is sufficient that the semiconductor device 10 has a bipolar type PN junction diode structure, and a conductivity type of each of a plurality of layers included in the support substrate 12 and the semiconductor film 14 is not limited to the above form.

The lower electrode 16 and the upper electrode 18 function as electrodes. For the lower electrode 16 and the upper electrode 18, for example, metal having sufficiently low electric resistance such as Ni, Cu, Ag, Au, Al, and Ti, or graphite carbon is used.

Here, in the semiconductor device 10, a stacking fault 24 may occur and develop internally.

FIGS. 2A to 2E are explanatory diagrams of an example of the occurrence and expansion of the stacking fault 24. Note that FIGS. 2A to 2E are transparent diagrams in a case where a dislocation is observed from a surface of the semiconductor device 10.

The semiconductor device 10 includes one or more basal plane dislocations (BPDs). The BPD is a dislocation present on the (0001) plane that is a basal plane of an SiC single crystal and becomes the basis of the stacking fault 24. The stacking fault 24 is a planar defect.

The BPD is a dislocation present in a state of being decomposed into two Shockley type partial dislocations on the (0001) plane that is the basal plane of the SiC single crystal. The stacking fault 24 of a planar shape is present in a minute region sandwiched between the two Shockley type partial dislocations. Such a stacking fault 24 is called a Shockley type stacking fault, and it is considered that the area of the stacking fault 24 increases as a partial dislocation moves due to the recombination energy of electrons and holes.

The BPD may be a dislocation specifically occurring in an interface S3 (see FIG. 1) between the support substrate 12 and the semiconductor film 14, a dislocation occurring a posteriori, for example, by scratching the surface of the semiconductor device 10, and the like in addition to a dislocation inherently present in the support substrate 12.

When electrical stress is applied to the semiconductor device 10 having the BPD, the stacking fault 24 originating from the BPD occurs and develops on a slip plane (mainly, close-packed plane). For example, in a bipolar element such as a pn diode using silicon carbide (SiC) having a 4H structure as the semiconductor material, the vicinity of an interface between an n-type epitaxial layer and a p-type epitaxial layer or the vicinity of the n-type epitaxial layer and a p-type injection layer are a region where electrons and holes are recombined at the time of current stress. In this region, the BPD is converted to the stacking fault 24 by recombination energy of electrons and holes generated at the time of current stress.

Figure 2A:
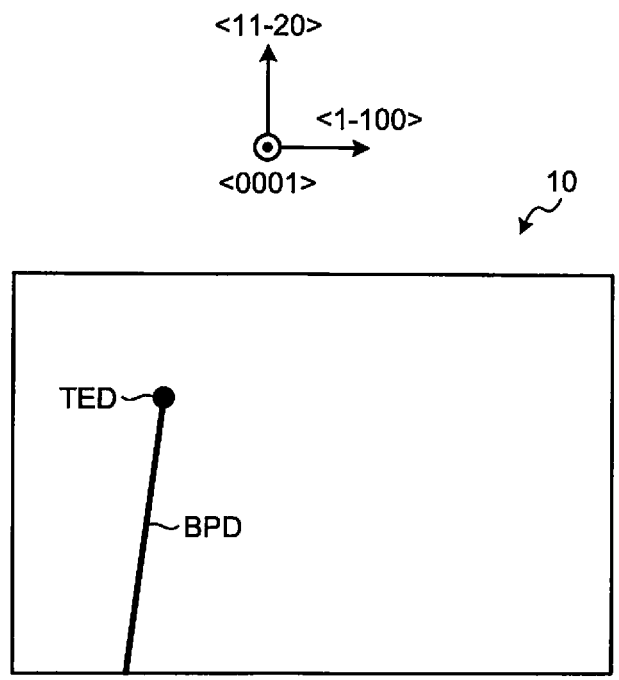
FIG. 2A is an explanatory diagram of the occurrence and expansion of a stacking fault.
Figure 2B:
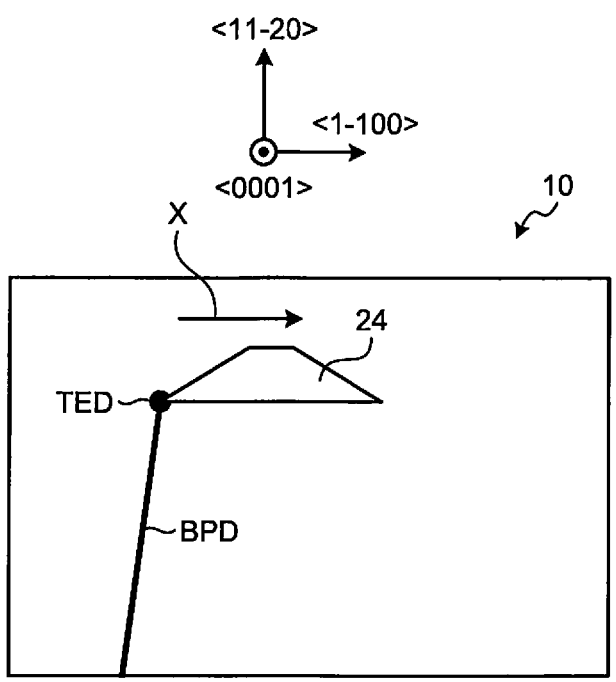
FIG. 2B is an explanatory diagram of the occurrence and expansion of the stacking fault.
Figure 2C:
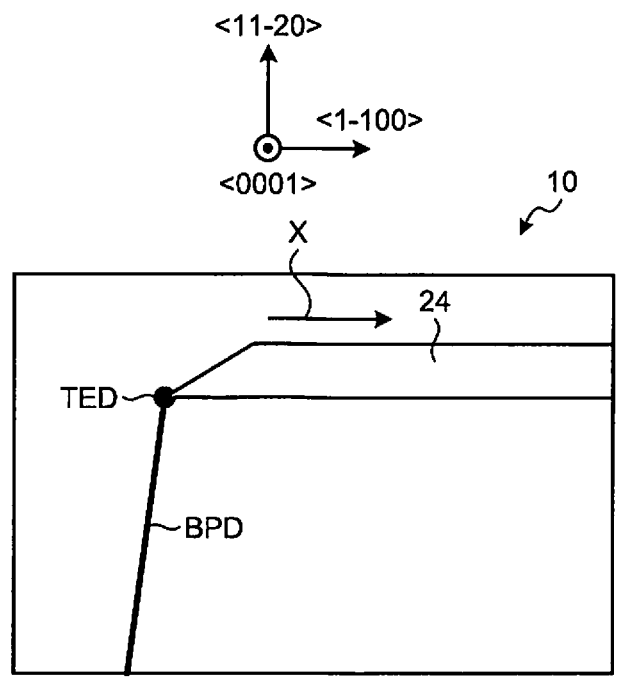
FIG. 2C is an explanatory diagram of the occurrence and expansion of the stacking fault.
Figure 2D:
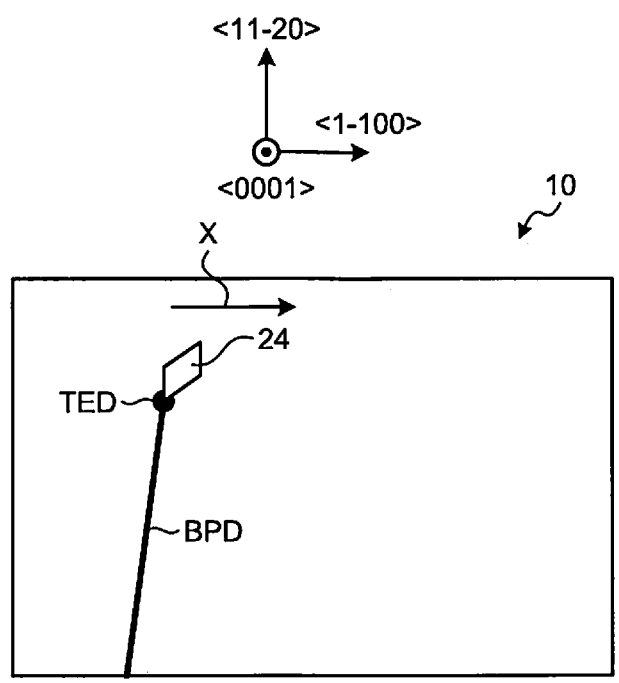
FIG. 2D is an explanatory diagram of the occurrence and expansion of the stacking fault.

For example, as illustrated in FIG. 2A, when a current having a current amount equal to or larger than a predetermined value is flowed into the semiconductor device 10 under a certain temperature condition, the stacking fault 24 occurs from the vicinity of a conversion point of a threading edge dislocation (TED) in the BPD (see, for example, FIGS. 2B and 2D).

Then, the stacking fault 24 develops starting from the vicinity of the conversion point from the BPD to the TED. For example, a expansion direction (direction of the arrow X) of the stacking fault 24 coincides with the <1-100> direction. Note that in the present embodiment, the expansion direction of the stacking fault 24 represents a main direction when the stacking fault 24 develops. Specifically, in a case where the stacking fault 24 develops while expanding along a plurality of directions, the expansion direction of the stacking fault 24 means a direction in which the defect expands. In the following description, the expansion direction of the stacking fault 24 may be referred to as a expansion direction X.

As illustrated in FIG. 2B, a cross-sectional shape of the stacking fault 24 along the slip plane ((0001) plane) develops into a trapezoidal shape. Then, as the expansion progresses further, as illustrated in FIG. 2C, an upstream-side end portion in the expansion direction X has a triangular shape, and the center and a downstream-side end portion in the expansion direction X develop into a rectangular band shape. Note that the stacking fault 24 develops to the downstream-side end portion in the expansion direction X of the semiconductor device 10, thereby stopping the expansion.

Figure 2E:
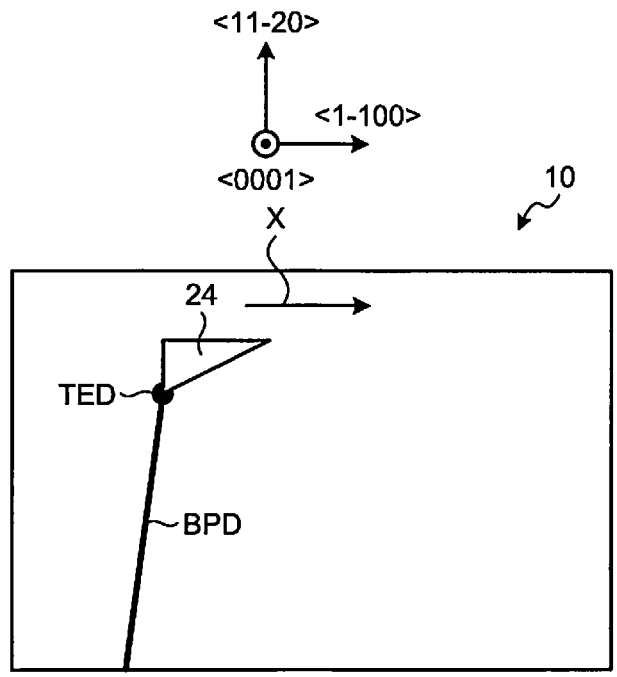
FIG. 2E is an explanatory diagram of the occurrence and expansion of the stacking fault.

Furthermore, for example, as illustrated in FIG. 2D, the cross-sectional shape of the stacking fault 24 along the slip plane ((0001) plane) develops into a quadrangular shape. Then, as the expansion progresses further, as illustrated in FIG. 2E, the stacking fault 24 develops into a triangle shape. Note that the stacking fault 24 develops to a P region in the semiconductor device 10, thereby stopping the expansion.

The region of the stacking fault 24 acts as a high resistance region when a current is applied. Therefore, a defect that when the area of the stacking fault 24 increases, a forward voltage of the semiconductor device 10 of a bipolar type increases and characteristics of the semiconductor device 10 deteriorate occurs.

In particular, there is a problem that when a crystal defect such as the BPD or the like present in the semiconductor film 14 changes into the stacking fault 24 of a planar shape due to current stress and the area of the stacking fault 24 increases due to the expansion of the stacking fault 24, the forward voltage increases and the characteristics of the semiconductor device 10 deteriorate.

Returning to FIG. 1, the description will be continued. Therefore, in the semiconductor device 10 according to the present embodiment, a total value of a change amount of chemical potential of the semiconductor device 10 with respect to the expansion direction X of the stacking fault 24 and the stacking fault energy of the stacking fault 24 is zero or more.

As a result of intensive studies, the present inventors have found that in a case where the total value of the change amount of the chemical potential of the semiconductor device 10 and the stacking fault energy of the stacking fault 24 included in the semiconductor device 10 is zero or more, it is possible to provide the semiconductor device 10 in which at least one of the occurrence and expansion of the stacking fault 24 is suppressed.

Specifically, the present inventors have found that the occurrence and expansion of the stacking fault 24 is defined by the chemical potential of the semiconductor device 10.

The chemical potential of the semiconductor device 10 means a sum of the chemical potentials of each layer and each film between the lower electrode 16 and the upper electrode 18 in the semiconductor device 10.

In particular, the chemical potential of the semiconductor device 10 is defined by a density distribution of electrons and holes in a region between the lower electrode 16 and the upper electrode 18 of the semiconductor device 10. Specifically, the chemical potential is represented by the following equations.

$$\mu = \mu_n + \mu_p \quad (1)$$

$$\mu_n = \int_\Omega \int_{E_i}^{\infty} (E-E_i) D_e(E) F_n(E) dE dx = \int_\Omega n(E_c - E_i + 3/2 k_B T) \frac{}{dx} \quad (2)$$

$$\mu_p = \int_\Omega \int_{-\infty}^{E_i} (E_i - E) D_n(E) F_n(E) dE dx = \int_\Omega p(E_i - E_v + 3/2 k_B T) \frac{}{dx} \quad (3)$$

In equation (1), $\mu$ represents the chemical potential of the semiconductor device 10. In equations (1) and (2), $\mu_n$ represents the chemical potential of electrons. In the equations (1) and (3), $\mu_p$ represents the chemical potential of a hole.

In equation (2), n represents an electron concentration. In equation (3), p represents a hole concentration. n and p are analytically determined. Ec represents an energy band of a conduction band. Ev represents an energy band of a valence band. Ei represents a Fermi level in an intrinsic semiconductor. $k_B$ represents a Boltzmann constant. T represents temperature.

The stacking fault 24 develops in a direction in which total energy in the semiconductor device 10 decreases. That is, the chemical potential of the semiconductor device 10 decreases with the occurrence and expansion of the stacking fault 24. Therefore, the change amount of the chemical potential of the semiconductor device 10 that changes with the occurrence and expansion of the stacking fault 24 represents a negative value. Furthermore, since the energy of the stacking fault 24 is attributable to a crystal structure, the energy can be considered to be constant.

The inventors of the present invention have found that if a total value of a change amount of chemical potential with respect to the <11-20> direction of the stacking fault 24 and the stacking fault energy of the stacking fault 24 is a negative value, the stacking fault 24 develops. The change amount of the chemical potential with respect to the expansion direction X of the stacking fault 24 represents the change amount of the chemical potential that changes with expansion of the stacking fault 24. That is, the inventor of the present invention has found that when the total value of the change amount of the chemical potential in the expansion direction X of the stacking fault 24 and the stacking fault energy of the stacking fault 24 is zero or more, the stacking fault 24 becomes unstable and the occurrence and expansion are suppressed.

Note that in the semiconductor device 10 according to the present embodiment, the total value of the change amount of the chemical potential of the semiconductor device 10 with respect to the expansion direction X of the stacking fault 24 and the stacking fault energy of the stacking fault 24 is zero or more, but regarding the occurrence, a total value of the change amount of the chemical potential, the stacking fault energy of the stacking fault 24, and the change amount of the formation energy of the dislocation is preferably zero or more, and is, more preferably, more than zero.

In order to adjust the total value of the change amount of the chemical potential of the semiconductor device 10 with respect to the expansion direction X of the stacking fault 24, and the stacking fault energy of the stacking fault 24 so that a relationship that the total value is zero or more is satisfied, the following method is used.

That is, a configuration of the semiconductor device 10 is adjusted so that the above relationship is satisfied on the basis of the change amount of the chemical potential of the semiconductor device 10 in accordance with at least one of a physical property value of the semiconductor device 10, the current amount of the current being flowed to the semiconductor device 10, and the environmental temperature of the semiconductor device 10.

Specifically, at least one of an impurity (donor and acceptor) concentration and a thickness of at least one of a plurality of layers (support substrate 12, N-type well layer 20, and $P^+$-type ion implantation layer 22) arranged between the lower electrode 16 and the upper electrode 18 in the semiconductor device 10 is adjusted. The thickness represents to a length of each layer in the semiconductor device 10 in the stacking direction (<0001> direction in the present embodiment). For example, it is preferable to adjust the thickness of the support substrate 12 to 5 µm or less.

Note that in the case of adjusting the impurity concentration of the semiconductor film 14, it is preferable to adjust the impurity concentration of the layer (the N-type well layer 20 in the example illustrated in FIG. 1) arranged at a position close to the interface S3 with the support substrate 12 in the semiconductor film 14.

Furthermore, in the case of adjusting the thickness, it is preferable to adjust the thickness of at least one of the support substrate 12 and the N-type well layer 20 among the plurality of layers arranged between the lower electrode 16 and the upper electrode 18. Furthermore, in a case where the N-type well layer 20 includes a plurality of layers, it is preferable to adjust the thickness of a layer closest to the support substrate 12. The layer closest to the support substrate 12 is, for example, a layer functioning as a buffer layer. Furthermore, from the viewpoint of not impairing the characteristics of the semiconductor device 10, it is preferable to adjust the thickness of the support substrate 12.

Figure 3:
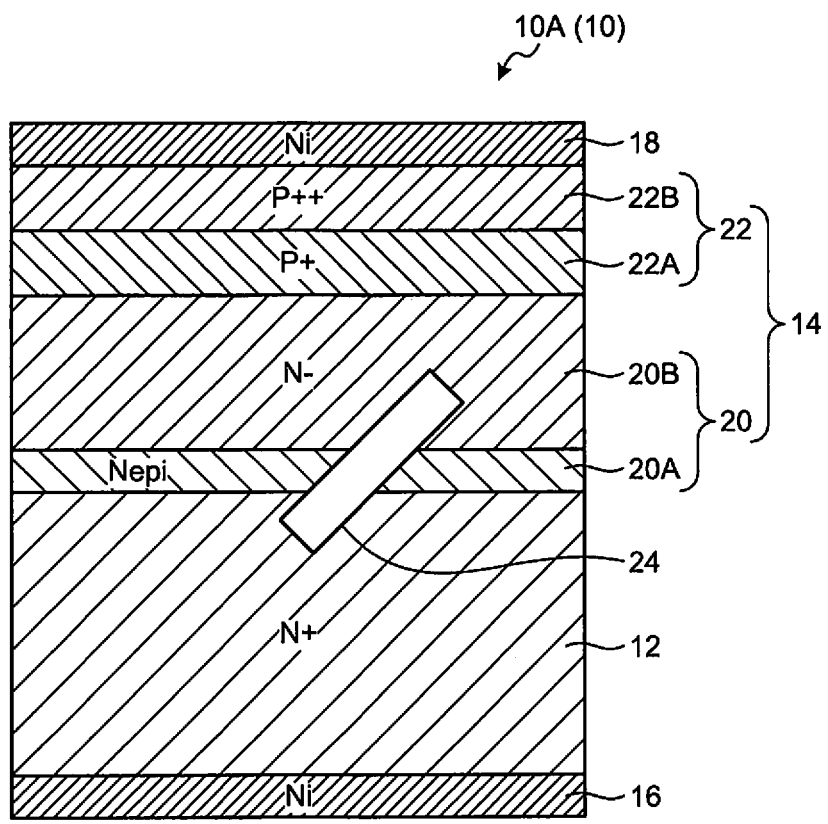
FIG. 3 is a schematic diagram of a semiconductor device.

FIG. 3 similar to FIG. 1 is a schematic diagram of a semiconductor device 10A for simulation. The inventors of the present invention conducted simulation using the semiconductor device 10A illustrated in FIG. 3 as the semiconductor device 10 for simulation.

The semiconductor device 10A is an example of the semiconductor device 10. The semiconductor device 10A is a laminate in which a lower electrode 16, a support substrate 12, a semiconductor film 14, and an upper electrode 18 are laminated in this order. The semiconductor film 14 of the semiconductor device 10A includes an N-type well layer 20 and a P$^+$-type ion implantation layer 22. Note that in this specification, the same reference numerals are given to parts having the same functions and configurations, and detailed description thereof may be omitted.

In the semiconductor device 10A for simulation, Ni electrodes were used as the lower electrode 16 and the upper electrode 18. Furthermore, as the support substrate 12, an N-type SiC substrate having an off-angle of 4° was used.

In the semiconductor device 10A for the simulation, the N-type well layer 20 is a laminate of a first well layer 20A and a second well layer 20B. The first well layer 20A is an N-type SiC epitaxial layer. The second well layer 20B is an N-type epitaxial layer and a layer having a different impurity concentration from that of the first well layer 20A. For the simulation, an N-type epitaxial growth layer having an impurity concentration of $5\times10^{17}$ was used as the first well layer 20A. Furthermore, as the second well layer 20B, an N-type epitaxial growth layer having an impurity concentration of $8\times10^{15}$ was used.

The P$^+$-type ion implantation layer 22 is an ion implantation layer in which an acceptor is injected into the epitaxial growth layer. For a first ion implantation layer 22A, a P-type ion-implementation layer having an acceptor (impurity) concentration of $3\times10^{18}$ was used. For a second ion implantation layer 22B, a P-type ion implantation layer having an acceptor concentration of $3\times10^{20}$ was used.

Then, a length of the stacking fault 24 and a change amount in chemical potential of the semiconductor device 10A when an electric current was applied to the lower electrode 16 and the upper electrode 18 of the semiconductor device 10A were analyzed.

Figure 4A:
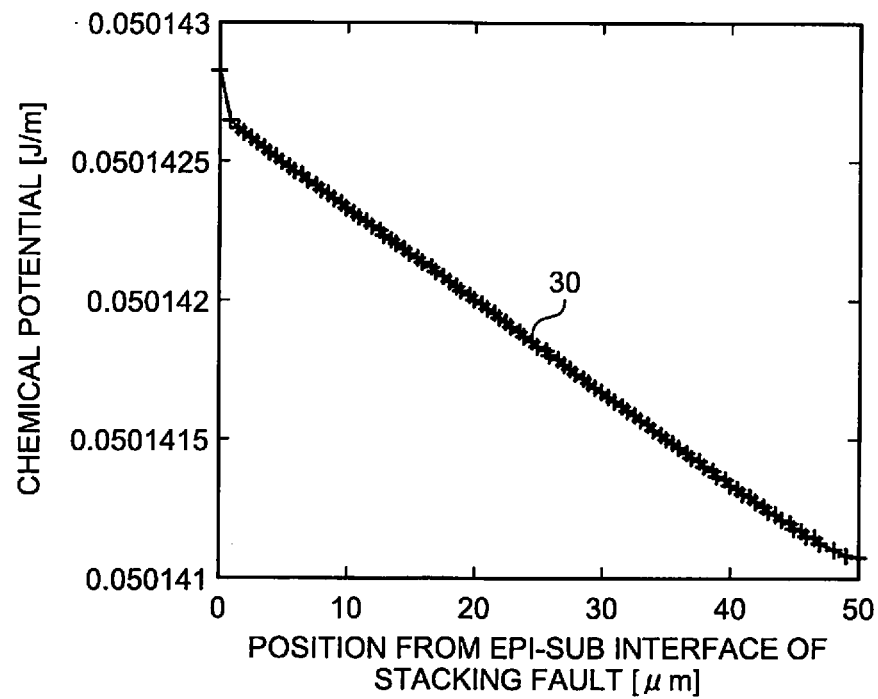
FIG. 4A is a line graph illustrating a relationship between a distance of the stacking fault from a substrate and chemical potential.

FIG. 4A is a line graph 30 illustrating a relationship between the length of the stacking fault 24 and the chemical potential when a current having a current amount of 100 A/cm$^2$ is applied to the semiconductor device 10A illustrated in FIG. 3. Note that a distance from a substrate of the stacking fault illustrated in FIG. 4B and FIGS. 5A to 6C, which will be described later, illustrates what is obtained by converting the length of the stacking fault 24 in the expansion direction X into a position from the thickness direction (<0001> direction) of the semiconductor device 10.

As illustrated in FIG. 4A, the chemical potential decreases with the expansion of the stacking fault 24. That is, the change amount of the chemical potential due to the expansion of the stacking fault 24 is represented by a slope in the line graph 30 and represents a negative value.

Figure 4B:
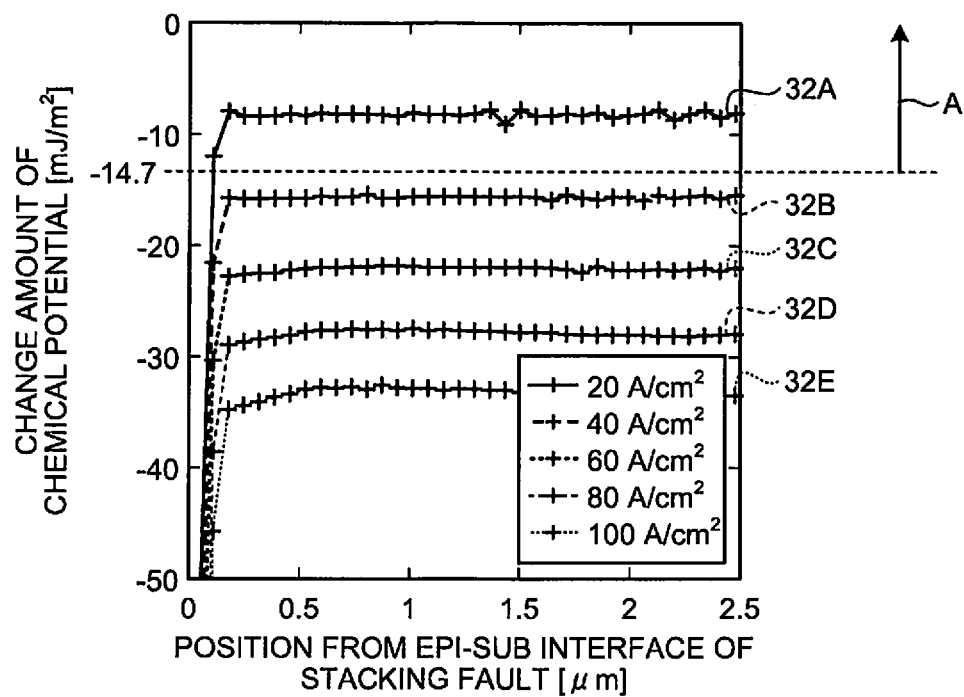
FIG. 4B is a line graph illustrating a relationship between the distance of the stacking fault from the substrate and a change amount of the chemical potential.

FIG. 4B is a line graph illustrating a relationship between the distance from the substrate of the stacking fault 24 and the change amount of the chemical potential when each of currents having current amounts of 20 A/cm$^2$, 40 A/cm$^2$, 60 A/cm$^2$, 80 A/cm$^2$, and 100 A/cm$^2$ is applied to the semiconductor device 10A illustrated in FIG. 3. Note that in FIG. 4B, line graphs 32A, 32B, 32C, 32D, and 32E illustrate line graphs when the current amounts of 20 A/cm$^2$, 40 A/cm$^2$, 60 A/cm$^2$, 80 A/cm$^2$, and 100 A/cm$^2$ are applied, respectively.

As described above, since the energy of the stacking fault 24 is attributable to the crystal structure, the energy of the stacking fault 24 can be considered to be constant. The energy of the stacking fault 24 of SiC is 14.7 mJ/m$^2$. Therefore, it can be said that by adjusting the configuration of the semiconductor device 10 so that the change amount of the chemical potential is in a range of −14.7 mJ/m$^2$ or more (range A in FIG. 4B), it is possible to suppress the occurrence and expansion of the stacking fault 24.

Figure 5A:
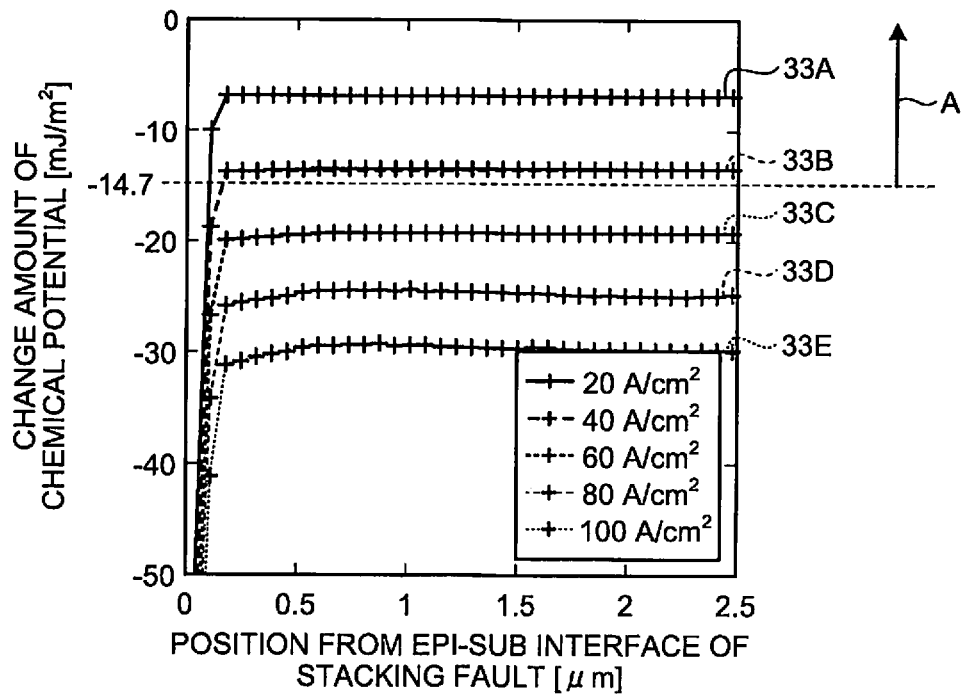
FIG. 5A is a line graph illustrating the relationship between the distance of the stacking fault from the substrate and the change amount of the chemical potential.
Figure 5B:
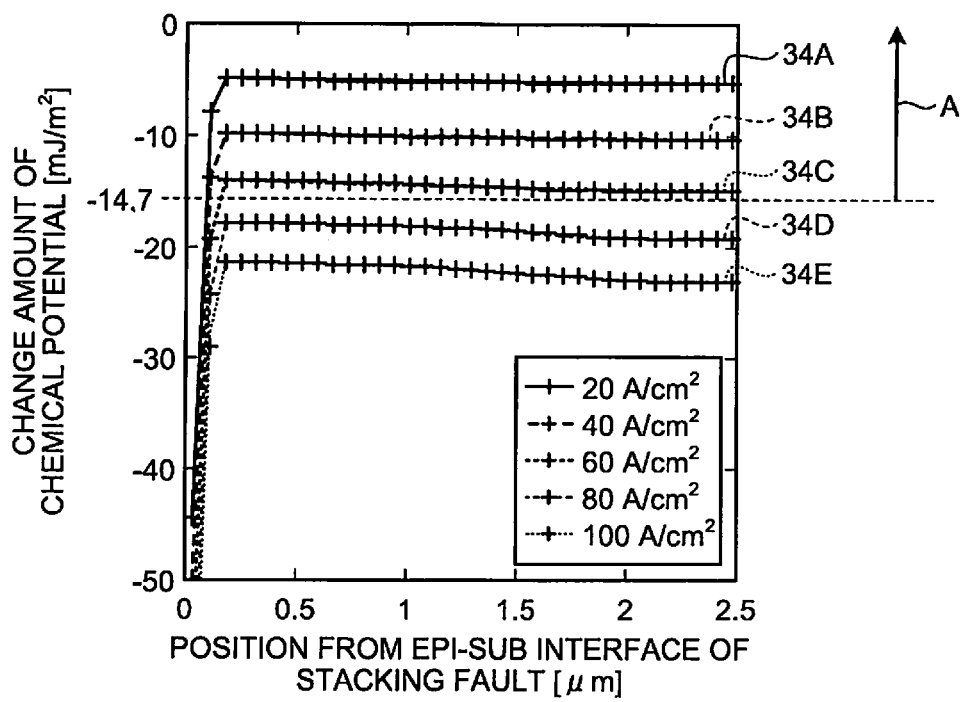
FIG. 5B is a line graph illustrating the relationship between the distance of the stacking fault from the substrate and the change amount of the chemical potential.
Figure 5C:
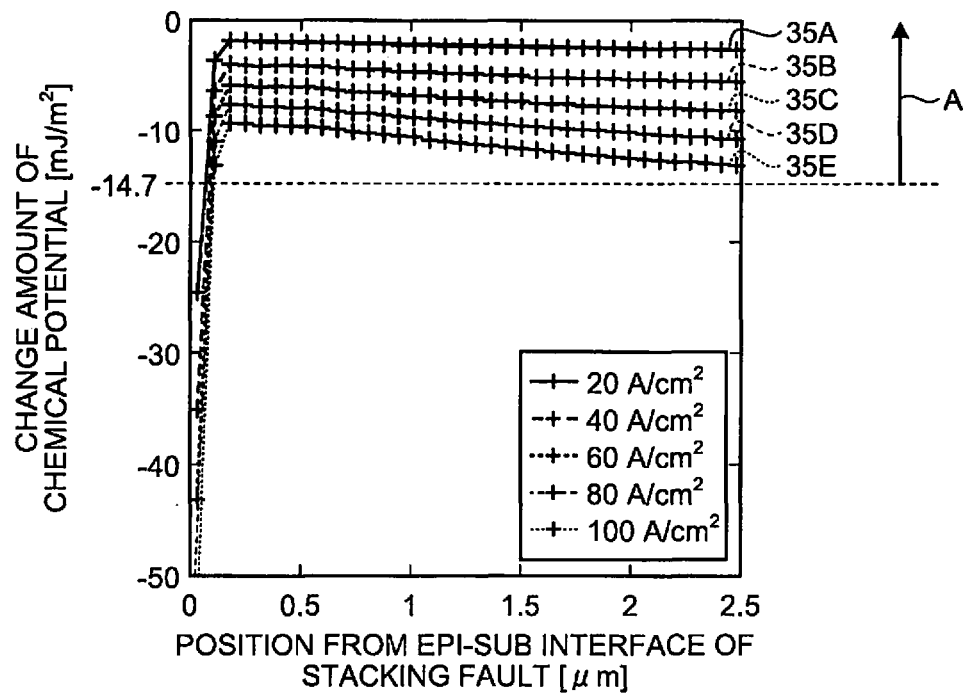
FIG. 5C is a line graph illustrating the relationship between the distance of the stacking fault from the substrate and the change amount of the chemical potential.

FIGS. 5A, 5B, and 5C are line graphs illustrating a relationship between the length of the stacking fault 24 and the change amount of the chemical potential when the support substrate 12 has an impurity concentration of $5\times10^{18}$/cm$^3$ and the thickness of the support substrate 12 is 10 μm, 0.5 μm, and 0.1 μm, respectively.

Note that in FIGS. 5A, 5B, and 5C, line graphs illustrating the relationship between the distance from the substrate of the stacking fault 24 and the change amount of the chemical potential and the change amount of the chemical potential when each of currents having the current amounts of 20 A/cm$^2$, 40 A/cm$^2$, 60 A/cm$^2$, 80 A/cm$^2$, and 100 A/cm$^2$ is applied are illustrated. In FIG. 5A, line graphs 33A, 33B, 33C, 33D, and 33E illustrate line graphs when the current amounts of 20 A/cm$^2$, 40 A/cm$^2$, 60 A/cm$^2$, 80 A/cm$^2$, and 100 A/cm$^2$ are applied, respectively. In FIG. 5B, line graphs 34A, 34B, 34C, 34D, and 34E illustrate line graphs when the current amounts of 20 A/cm$^2$, 40 A/cm$^2$, 60 A/cm$^2$, 80 A/cm$^2$, and 100 A/cm$^2$ are applied, respectively. In FIG. 5C, line graphs 35A, 35B, 35C, 35D, and 35E illustrate line graphs when the current amounts of 20 A/cm$^2$, 40 A/cm$^2$, 60 A/cm$^2$, 80 A/cm$^2$, and 100 A/cm$^2$ are applied, respectively.

As illustrated in FIGS. 5A to 5C, it can be said that in a case where the impurity concentration of the support substrate 12 is constant, the thinner the thickness of the support substrate 12 is, the more the change amount of the chemical potential can be adjusted to the range of −14.7 mJ/m$^2$ or more (range A) and the more the occurrence and expansion of the stacking fault 24 can be suppressed.

Figure 6A:
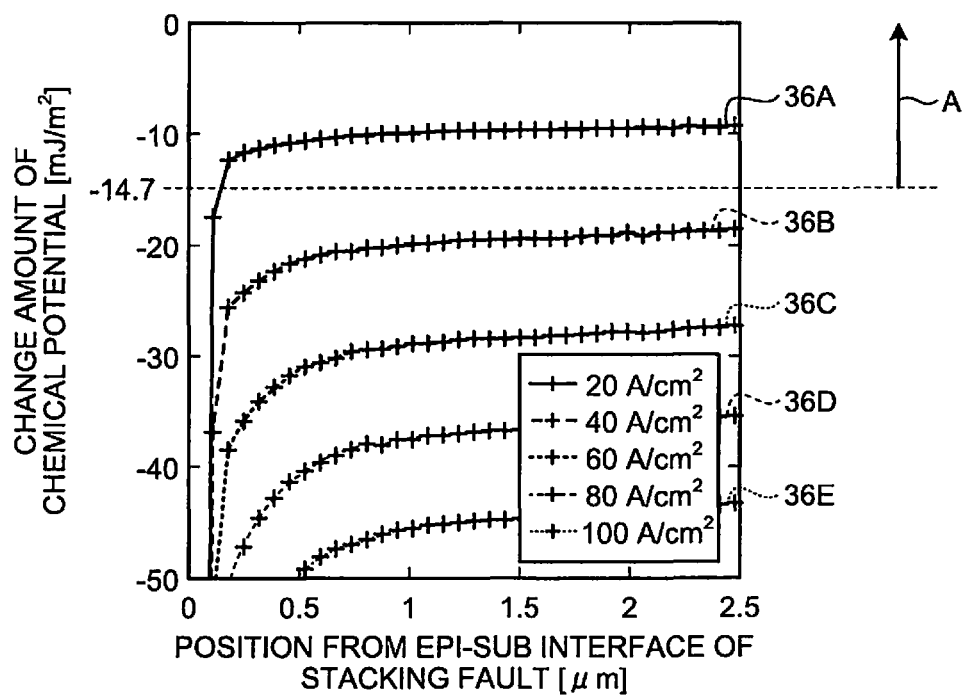
FIG. 6A is a line graph illustrating the relationship between the distance of the stacking fault from the substrate and the change amount of the chemical potential.
Figure 6B:
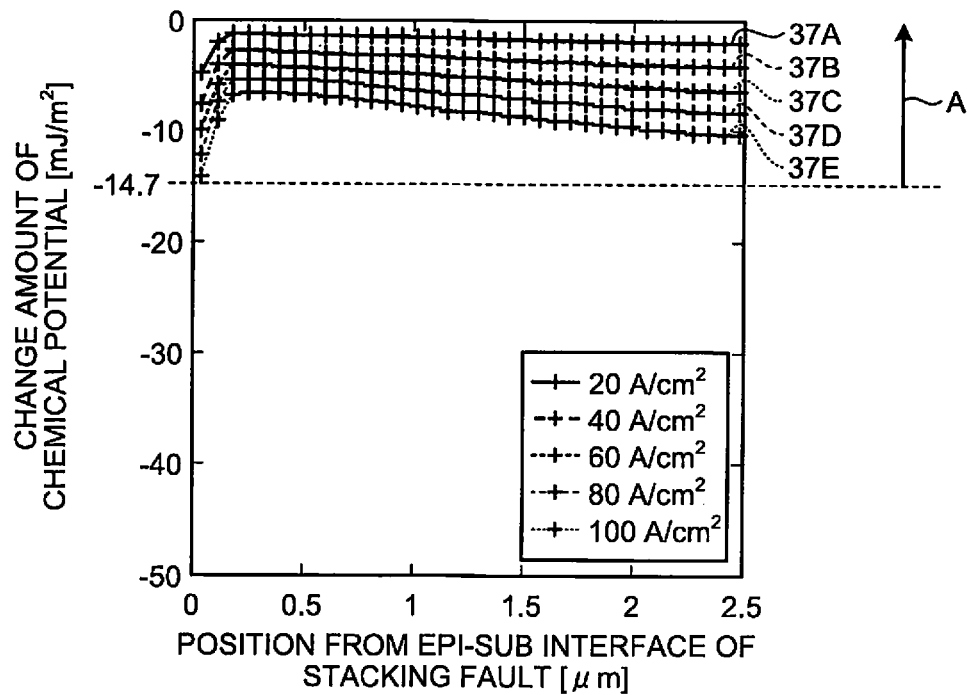
FIG. 6B is a line graph illustrating the relationship between the distance of the stacking fault from the substrate and the change amount of the chemical potential.
Figure 6C:
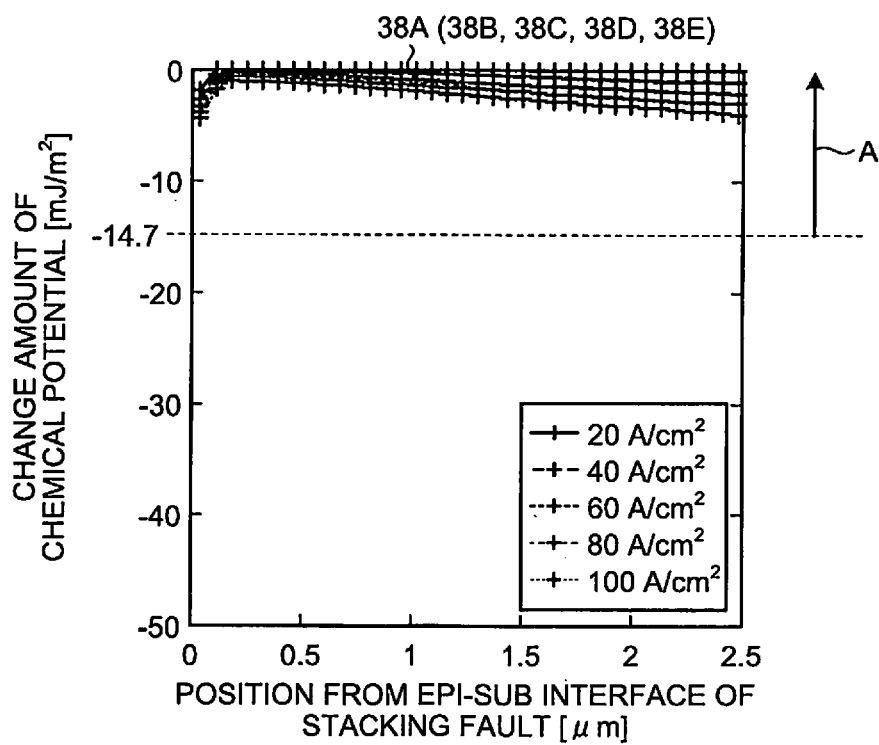
FIG. 6C is a line graph illustrating the relationship between the distance of the stacking fault from the substrate and the change amount of the chemical potential.

FIGS. 6A, 6B, and 6C are line graphs illustrating the relationship between the distance from the substrate of the stacking fault 24 and the change amount of the chemical potential when the impurity concentration of the support substrate 12 is $5\times10^{17}$/cm$^3$ and the thicknesses of the support substrate 12 are 10 μm, 0.5 μm, and 0.1 μm, respectively. That is, FIGS. 6A, 6B, and 6C illustrate graphs illustrating simulation results in a case where the condition of the thickness of the support substrate 12 is the same as that in each of FIGS. 5A, 5B, and 5C and the impurity concentration of the support substrate 12 is lowered.

Note that in FIGS. 6A, 6B, and 6C, line graphs illustrating the relationship between the length of the stacking fault 24 and the change amount of the chemical potential when each of currents having the current amounts of 20 A/cm$^2$, 40 A/cm$^2$, 60 A/cm$^2$, 80 A/cm$^2$, and 100 A/cm$^2$ is applied are illustrated. In FIG. 6A, line graphs 36A, 36B, 36C, 36D, and 36E illustrate line graphs illustrating when the current amounts of 20 A/cm$^2$, 40 A/cm$^2$, 60 A/cm$^2$, 80 A/cm$^2$, and 100 A/cm$^2$ are applied, respectively. Furthermore, in FIG. 6B, line graphs 37A, 37B, 37C, 37D, and 37E illustrate line graphs when the current amounts of 20 A/cm$^2$, 40 A/cm$^2$, 60 A/cm$^2$, 80 A/cm$^2$, and 100 A/cm$^2$ are applied respectively. In FIG. 6C, line graphs 38A, 38B, 38C, 38D, and 38E illustrate line graphs when the current amounts of 20 A/cm$^2$, 40 A/cm$^2$, 60 A/cm$^2$, 80 A/cm$^2$, and 100 A/cm$^2$ are applied, respectively.

As illustrated in FIGS. 6A to 6C, it can be said that in a case where the impurity concentration of the support substrate 12 is constant, as the thinner the thickness of the support substrate 12 is, the more the change amount of the chemical potential can be adjusted to the range of −14.7 mJ/m$^2$ or more (range A) and the more the occurrence and expansion of the stacking fault 24 can be suppressed. Furthermore, as illustrated in FIGS. 6A to 6C and FIGS. 5A to 5C, it can be said that the lower the impurity concentration of the support substrate 12 is, the more easily the change amount of the chemical potential can be adjusted to the range of −14.7 mJ/m² or more (range A) and the more the occurrence and expansion of the stacking fault 24 can be suppressed.

As described above, in order to adjust the total value of the change amount of the chemical potential in the expansion direction X of the stacking fault 24 and the stacking fault energy of the stacking fault 24 so that the relationship that the total value is zero or more is satisfied, at least one of the impurity concentration and the thickness of at least one of the plurality of layers (support substrate 12, N-type well layer 20, and P⁺-type ion implantation layer 22) arranged between the lower electrode 16 and the upper electrode 18 is adjusted.

For example, as illustrated in the above simulation results, the thinner the thickness of the support substrate 12 is adjusted to be, the more effectively it is possible to adjust the total value of the change amount of the chemical potential in the expansion direction X of the stacking fault 24 and the stacking fault energy of the stacking fault 24 so that the relationship that the total value is zero or more is satisfied.

Furthermore, for example, as illustrated in the above simulation results, the lower the impurity concentration of the support substrate 12 is adjusted to be, the more effectively it is possible to adjust the change amount of the chemical potential in the expansion direction X of the stacking fault 24 and the stacking fault energy of the stacking fault 24 so that the relationship that the total value is zero or more is satisfied.

Note that in the semiconductor device 10 according to the present embodiment, the thickness and the impurity concentration of each layer is adjusted so as to satisfy the above relationship at the time of manufacturing, and the method of manufacturing is not limited.

For example, the semiconductor device 10 generates an epitaxial growth film by epitaxially growing an SiC film on the support substrate 12 that is the SiC substrate to which the donor such as phosphorus (P) or arsenic (As) is added. Then, the acceptor such as boron (B) or aluminum (Al) is ion-implanted into an upper layer portion of the epitaxial growth film. By this implantation process, the semiconductor film 14 in which a part close to the support substrate 12 is the N-type well layer 20 and a part far from the support substrate 12 is the P⁺-type ion implantation layer 22 is formed. Then, by forming the lower electrode 16 and the upper electrode 16, the semiconductor device 10 is manufactured.

At the time of manufacturing the semiconductor device 10, at least one of the thickness of the support substrate 12, the impurity concentration of the support substrate 12, the thickness of each layer constituting the semiconductor film 14, and the impurity concentration of each layer constituting the semiconductor film 14 is adjusted. As a result, the semiconductor device 10 illustrating the relationship that the total value of the change amount of the chemical potential in the expansion direction X of the stacking fault 24 and the stacking fault energy of the stacking fault 24 is zero or more is manufactured.

As described above, in the semiconductor device 10 according to the present embodiment is, the total value of the change amount of the chemical potential of the semiconductor device 10 with respect to the expansion direction X of the stacking fault 24 and the stacking fault energy of the stacking fault 24 is zero or more.

Therefore, the semiconductor device 10 according to the present embodiment is a semiconductor device 10 in which at least one of the occurrence and the expansion of the stacking fault 24 is suppressed.

Therefore, in the present embodiment, it is possible to provide the semiconductor device 10 in which the stacking fault 24 is suppressed.

Second Embodiment

In the above embodiment, the form in which the impurity concentration and the thickness of at least one of the plurality of layers (support substrate 12, N-type well layer 20, P⁺-type ion implantation layer 22) arranged between the lower electrode 16 and the upper electrode 18 is adjusted, whereby the total value of the change amount of the chemical potential of the semiconductor device 10 with respect to in the expansion direction X of the stacking fault 24 and the stacking fault energy of the stacking fault 24 is adjusted so that the relationship that the total value is zero or more is satisfied has been described.

However, by further providing a trench in a support substrate 12, an adjustment may be performed so that a relationship that a total value of a change amount of the chemical potential of a semiconductor device 10 with respect to a expansion direction X of a stacking fault 24 and the stacking fault energy of the stacking fault 24 is zero or more is satisfied.

Figure 7:
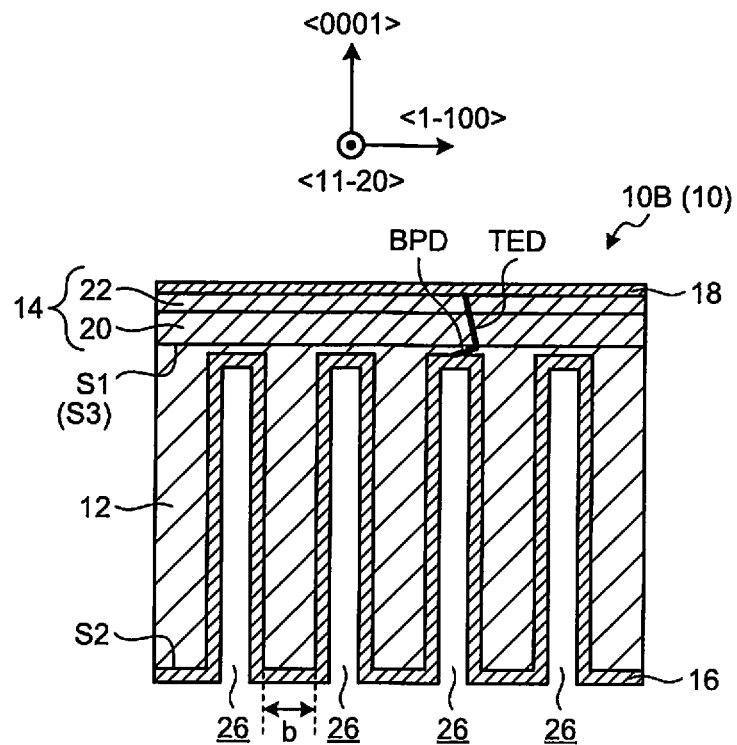
FIG. 7 is a schematic diagram of a semiconductor device.

FIG. 7 is a schematic diagram illustrating an example of a semiconductor device 10B according to the present embodiment. The semiconductor device 10B is an example of the semiconductor device 10. FIG. 7 is an example of a cross-sectional view of the semiconductor device 10B taken along a plane perpendicular to a (0001) plane of silicon carbide (SiC) having a hexagonal structure.

The semiconductor device 10B includes a lower electrode 16, a support substrate 12, a semiconductor film 14, and an upper electrode 18. The lower electrode 16, the semiconductor film 14, and the upper electrode 18 are the same as those in the first embodiment.

In the present embodiment, the support substrate 12 includes a trench 26. Specifically, the support substrate 12 includes the trench 26 opening on a second surface S2 of the support substrate 12 and extending from the second surface S2 toward the semiconductor film 14.

The lower electrode 16 is arranged so as to cover the second surface S2 of the support substrate 12 and an inner wall surface (inner side surface and inner basal surface) of the trench 26.

Note that the number of the trenches 26 provided in the support substrate 12 is not limited. However, the support substrate 12 preferably includes a plurality of trenches 26 opening on the second surface S2 of the support substrate 12. In FIG. 7, a mode in which a plurality of trenches 26 is arrayed at intervals along the second surface S2 of the support substrate 12 is illustrated as an example.

It is sufficient that the trench 26 is a groove configured to open on the second surface S2 of the support substrate 12 and has a basal surface closer to a first surface S1 of the support substrate 12. The basal surface of the trench 26 represents an end surface closer to the semiconductor film 14 in a thickness direction (<0001> direction) of the semiconductor device 10B on the inner wall surface of the trench 26.

The basal surface of the trench 26 is positioned closer to the second surface S2 of the support substrate 12 than the interface S3 between the support substrate 12 and the semiconductor film 14. In other words, the basal surface of the trench 26 is positioned closer to the second surface S2 than the first surface S1 of the support substrate 12. That is, a depth of the trench 26 (a length of the trench 26 in the <0001> direction) is less than a thickness of the support substrate 12.

Figure 8A:
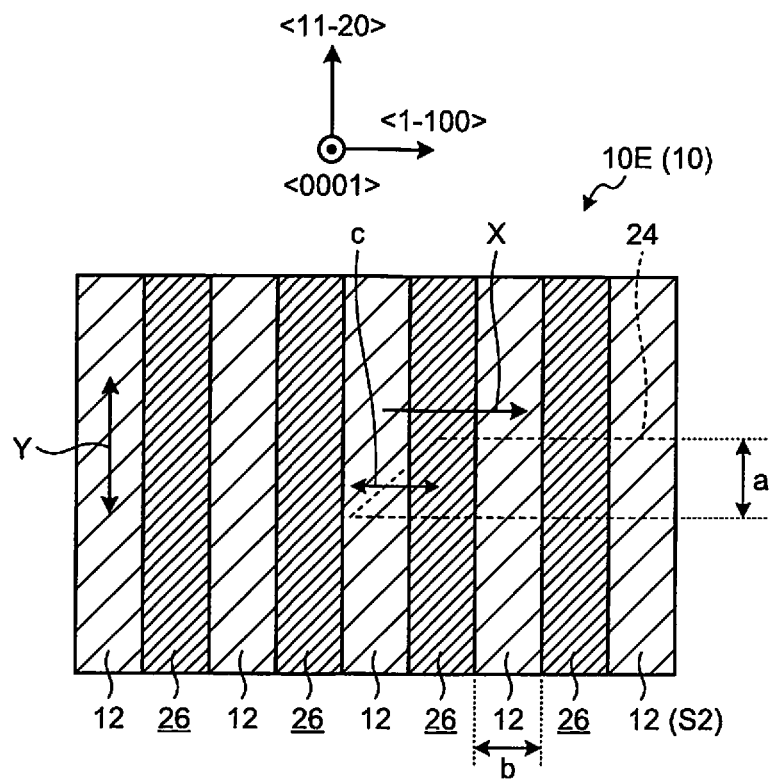
FIG. 8A is a plan view of a semiconductor device.
Figure 8B:
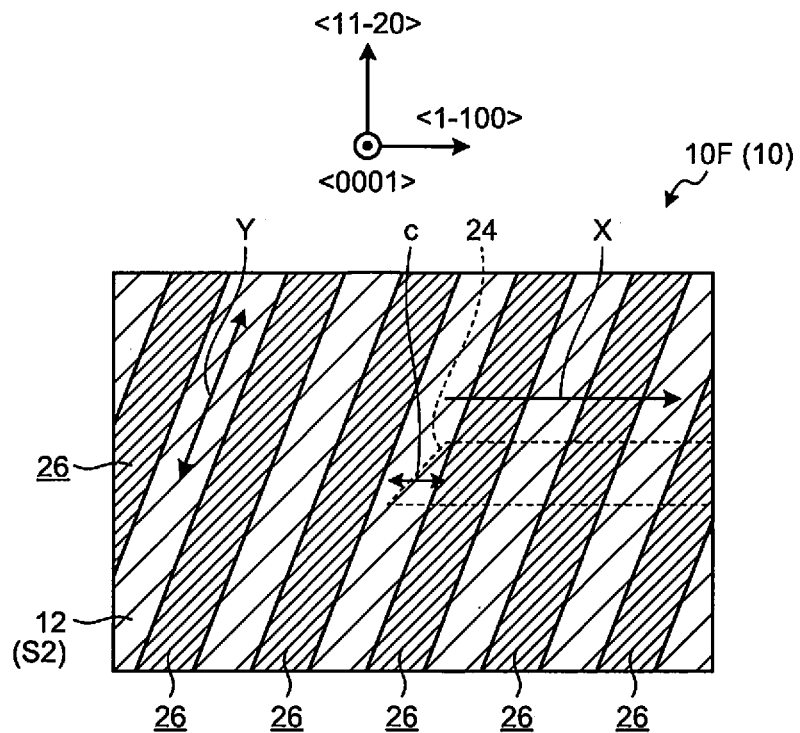
FIG. 8B is a plan view of a semiconductor device.
Figure 8C:
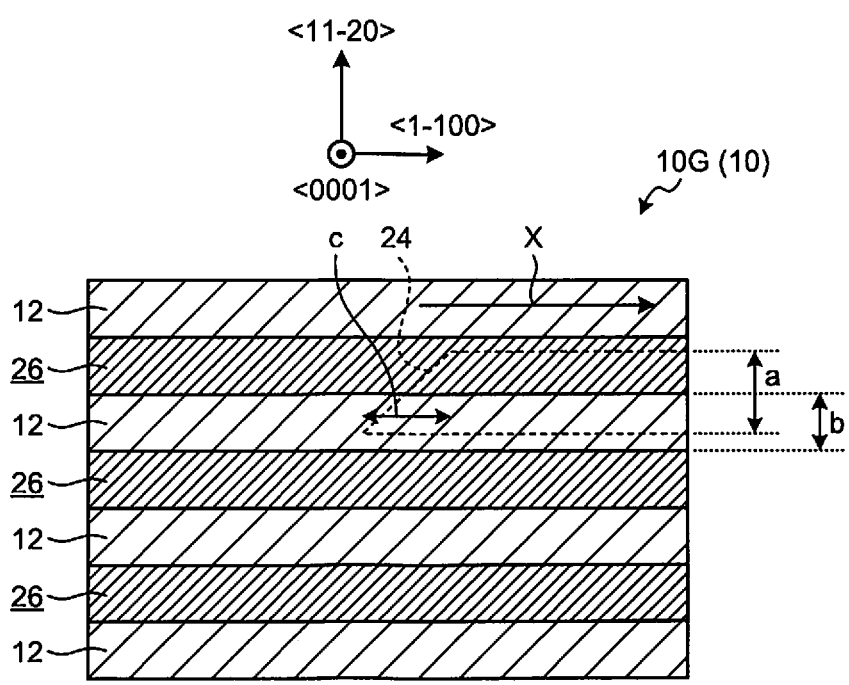
FIG. 8C is a plan view of a semiconductor device.

The trench 26 is arranged to extend in a direction along the second surface S2 of the support substrate 12. The extending direction of the trench 26 on the second surface S2 is not limited. FIGS. 8A, 8B, and 8C are each an example of a plan view in which the semiconductor device 10B is viewed from the second surface S2 of the support substrate 12 (semiconductor device 10E, semiconductor device 10F, and semiconductor device 10G). In other words, FIG. 8A, FIG. 8B, and FIG. 8C are each an example of a cross-sectional view taken along the (0001) plane of the support substrate 12 of the semiconductor device 10B. Note that the semiconductor device 10E is an example of the semiconductor device 10B. The semiconductor device 10F is an example of the semiconductor device 10B. The semiconductor device 10G is an example of the semiconductor device 10B.

As illustrated in FIGS. 8A and 8B, an extending direction Y along the second surface S2 of the trench 26 is preferably a direction crossing the expansion direction X of the stacking fault 24. If the extending direction Y of the trench 26 is a direction crossing the expansion direction X of the stacking fault 24, it is possible to suppress the expansion of the stacking fault 24 in a region where the stacking fault 24 and the trench 26 cross each other.

Note that the extending direction Y along the second surface S2 of the trench 26 may be a direction parallel to the expansion direction X of the stacking fault 24 as illustrated in FIG. 8C.

However, from the viewpoint of effectively suppressing the expansion of the stacking fault 24, the extending direction Y along the second surface S2 of the trench 26 is preferably the direction crossing the expansion direction X of the stacking fault 24.

As described with reference to the above FIGS. 2B and 2C, the expansion direction X of the stacking fault 24 that has developed into a band shape is the <1-100> direction. Therefore, by setting the extending direction Y along the second surface S2 of the trench 26 to be the direction crossing the expansion direction X, it is possible to block the expansion of the stacking fault 24 along the expansion direction X and suppress the growth of the stacking fault 24.

An interval between the adjacent trenches 26 in the support substrate 12 is not limited.

However, an interval b between the trenches 26 that are adjacent to each other along the second surface S2 of the support substrate 12 is preferably less than a length c in the expansion direction X until reaching a surface of the stacking fault 24. The length c in the expansion direction X until reaching the surface of the stacking fault 24 represents a maximum length in the expansion direction X when the stacking fault 24 develops to the surface in the semiconductor device 10 (see FIGS. 8A to 8C).

If the interval b between the adjacent trenches 26 is less than the length c in the expansion direction X until reaching the surface of the stacking fault 24, it is possible to effectively suppress that the stacking fault 24 occurring in a region corresponding to a space between the trenches 26 in the semiconductor device 10 develops beyond the trenches 26.

Furthermore, the interval b between the trenches 26 that are adjacent to each other along the second surface S2 of the support substrate 12 is preferably less than a length a in the direction crossing the expansion direction X of the stacking fault 24. The length a of the stacking fault 24 in the direction crossing the expansion direction X illustrates a maximum value of a length of the stacking fault 24 in a cut surface along the second surface S2 to a surface in a direction perpendicular to the expansion direction X.

If the interval b between the adjacent trenches 26 is less than the length a in the direction crossing the expansion direction X of the stacking fault 24, it is possible to suppress the expansion of the stacking fault 24 in the direction crossing the expansion direction X.

As described above, in the present embodiment, the support substrate 12 is provided with the trench 26.

By providing the trench 26 in the support substrate 12, it is possible to adjust to satisfy the relationship that the total value of the change amount of the chemical potential of the semiconductor device 10 with respect to the expansion direction X of the stacking fault 24 and the stacking fault energy of the stacking fault 24 is zero or more.

Figure 9A:
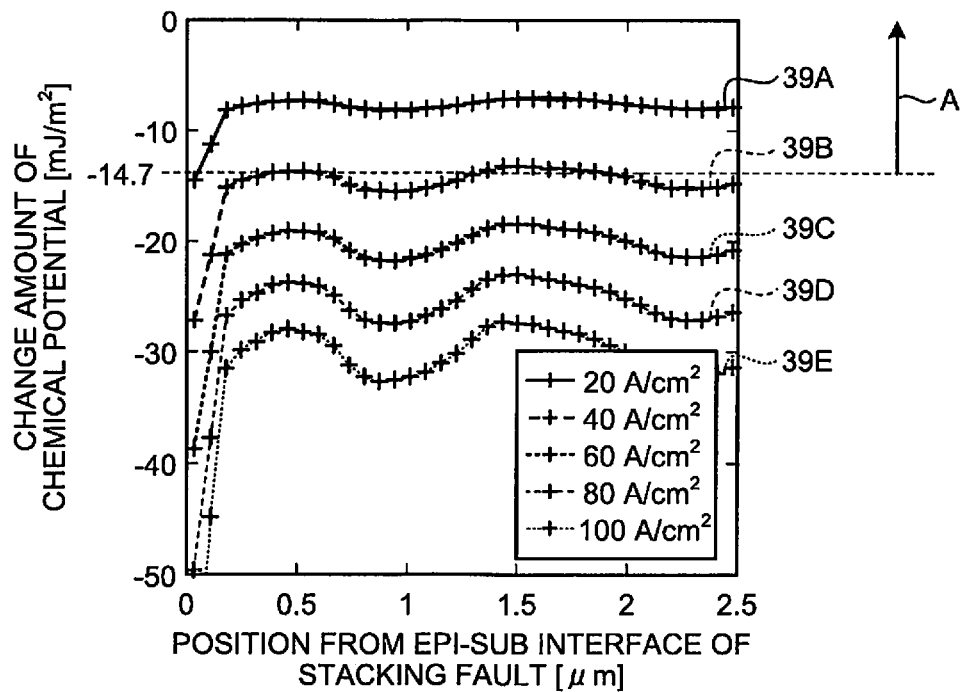
FIG. 9A is a line graph illustrating the relationship between the distance of the stacking fault from the substrate and the change amount of the chemical potential.

FIG. 9A is a line graph illustrating a relationship between a length of the stacking fault 24 and a change amount of the chemical potential of the semiconductor device 10B when the thickness of the support substrate 12 is 9.9 μm and a distance between the basal surface of the trench 26 in the support substrate 12 and the first surface S1 of the support substrate 12 is 0.4 μm.

Figure 9B:
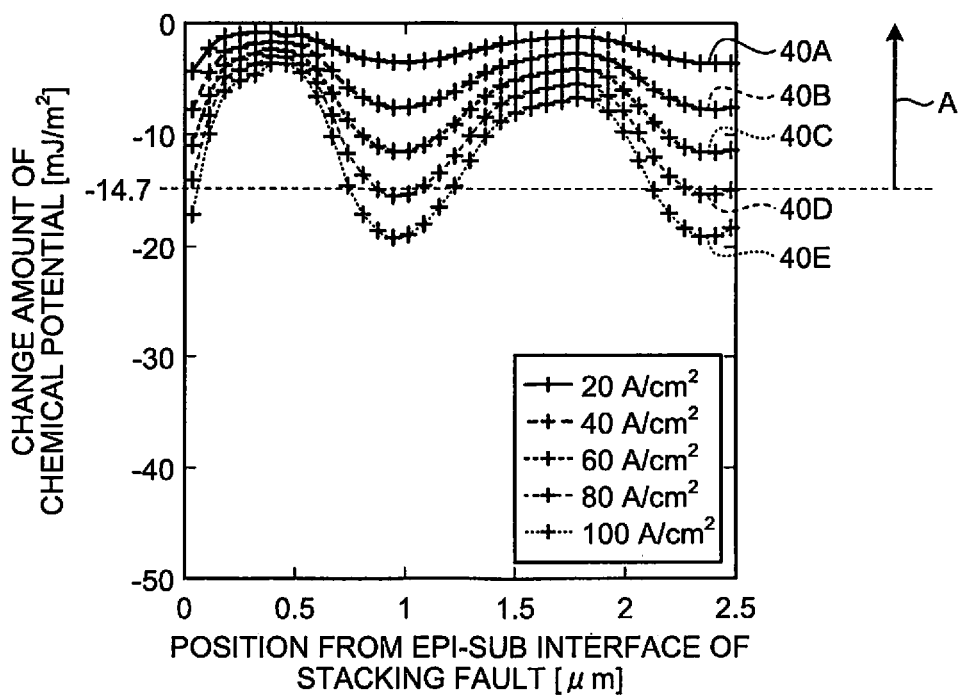
FIG. 9B is a line graph illustrating the relationship between the distance of the stacking fault from the substrate and the change amount of the chemical potential.

FIG. 9B is a line graph illustrating the relationship between the length of the stacking fault 24 and the change amount of the chemical potential of the semiconductor device 10B when the thickness of the support substrate 12 is 9.9 μm and the distance between the basal surface of the trench 26 in the support substrate 12 and the first surface S1 of the support substrate 12 is 0.1 μm.

Note that in FIGS. 9A and 9B, line graphs illustrating the relationship between the length of the stacking fault 24 and the change amount of the chemical potential when currents having the current amounts of 20 $A/cm^2$, 40 $A/cm^2$, 60 $A/cm^2$, 80 $A/cm^2$, and 100 $A/cm^2$ are applied are illustrated. In FIG. 9A, line graphs 39A, 39B, 39C, 39D, and 39E illustrate line graphs when the current amounts of 20 $A/cm^2$, 40 $A/cm^2$, 60 $A/cm^2$, 80 $A/cm^2$, and 100 $A/cm^2$ are applied, respectively. In FIG. 9B, line graphs 40A, 40B, 40C, 40D, and 40E illustrate line graphs when the current amounts of 20 $A/cm^2$, 40 $A/cm^2$, 60 $A/cm^2$, 80 $A/cm^2$, and 100 $A/cm^2$ are applied, respectively.

Furthermore, the length of the stacking fault 24 illustrated in FIGS. 9A and 9B represents the length of the stacking fault 24 in the expansion direction X.

As illustrated in FIGS. 9A and 9B, it can be said that by providing the trench 26 in the support substrate 12 and adjusting the depth of the trench 26 (that is, the distance between the basal surface of the trench 26 and the first surface S1), it is possible to adjust the change amount of the chemical potential to a range of $-14.7$ $mJ/m^2$ or more (range A) and suppress the occurrence and expansion of the stacking fault 24.

That is, by providing the trench 26 in the support substrate 12, it is possible to provide a thin region of the support substrate 12 on the support substrate 12. Therefore, it is possible to easily adjust a total value of the change amount of the chemical potential of the semiconductor device 10B and the stacking fault energy of the stacking fault 24 so that the relationship that the total value is zero or more is satisfied while the strength of the support substrate 12 is maintained.

Note that a method of manufacturing the semiconductor device 10B according to the present embodiment is not limited. That is, in the semiconductor device 10B according to the present embodiment, the trench 26 is formed so that the relationship that the total value of the change amount of the chemical potential in the expansion direction X of the stacking fault 24 and the stacking fault energy of the stacking fault 24 is zero or more is satisfied.

For example, the semiconductor device 10B generates an epitaxial grow film by epitaxially growing an SiC film on the first surface S1 of the support substrate 12 that is the SiC substrate to which a donor such as phosphorus (P) or arsenic (As) is added. Then, the acceptor such as boron (B) or aluminum (Al) is ion-implanted into an upper layer portion of the epitaxial growth film. By this implantation process, the semiconductor film 14 in which a part closer to the support substrate 12 is the N-type well layer 20 and a part farther from the support substrate 12 is the P+-type ion implantation layer 22 is formed.

Then, after a mask layer of a silicon oxide film or the like that is patterned in accordance with a formation region of the trench 26 is formed on the second surface S2 of the support substrate 12, etching is performed by reactive ion etching (RIE), a trench etcher or the like, the trench 26 is formed. At this time, the depth is adjusted so that the basal surface of the trench 26 does not penetrate the support substrate 12. Note that the trench 26 may be formed by dicing the support substrate 12 from the second surface S2. Then, after the mask layer is removed, the lower electrode 16 and the upper electrode 18 are formed, whereby the semiconductor device 10 is manufactured.

As described above, the support substrate 12 of the semiconductor device 10B according to the present embodiment includes the trench 26. Therefore, it is possible to provide the semiconductor device 10B that satisfies the relationship that the total value of the change amount of the chemical potential of the semiconductor device 10B and the stacking fault energy of the stacking fault 24 is zero or more while the strength of the support substrate 12 is maintained.

First Modification

Note that in the above second embodiment, a mode in which the lower electrode 16 is arranged so as to cover the second surface S2 of the support substrate 12 and the inner wall surface (inner side surface and inner basal surface) of the trench 26 is illustrated as an example.

However, a trench 26 may be filled with a lower electrode 16.

Figure 10:
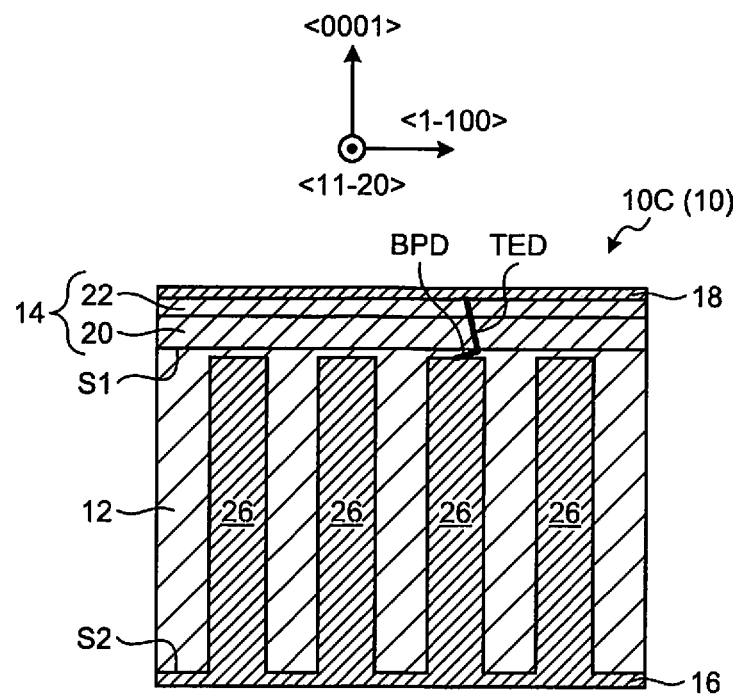
FIG. 10 is a schematic diagram of a semiconductor device.

FIG. 10 is a schematic diagram illustrating an example of a semiconductor device 10C according to the present modification. The semiconductor device 10C is an example of the semiconductor device 10.

The semiconductor device 10C includes a lower electrode 16, a support substrate 12, a semiconductor film 14, and an upper electrode 18. The support substrate 12 includes a trench 26. In the present modification, the trench 26 of the support substrate 12 is filled with the lower electrode 16.

The semiconductor device 10C is manufactured in a manner similar to that of the second embodiment except that the semiconductor device 10C is manufactured so that the trench 26 is filled with the lower electrode 16.

As described above, in the semiconductor device 10C according to the present modification, the trench 26 is filled with the lower electrode 16.

The trench 26 is filled with the lower electrode 16, whereby it is possible to easily adjust a total value of a change amount of chemical potential of the semiconductor device 10C and the stacking fault energy of the stacking fault 24 so that the relationship that the total value is zero or more is satisfied while the strength of the support substrate 12 is further improved, as compared with the above second embodiment.

Second Modification

Note that in the above second embodiment and the above first modification, when the semiconductor device 10B and the semiconductor device 10C are manufactured, the depth is adjusted so that the basal surface of the trench 26 does not penetrate the support substrate 12, whereby the trench 26 having the basal surface of the trench 26 that is positioned closer to the second surface S2 than the interface S3 between the support substrate 12 and the semiconductor film 14 is formed.

However, it is sufficient that at least a part of a basal surface B of a trench 26 is positioned closer to a second surface S2 than an interface S3. Furthermore, a method of forming the trench 26 is not limited to the method described in the above second embodiment and the above modification.

Figure 11A:
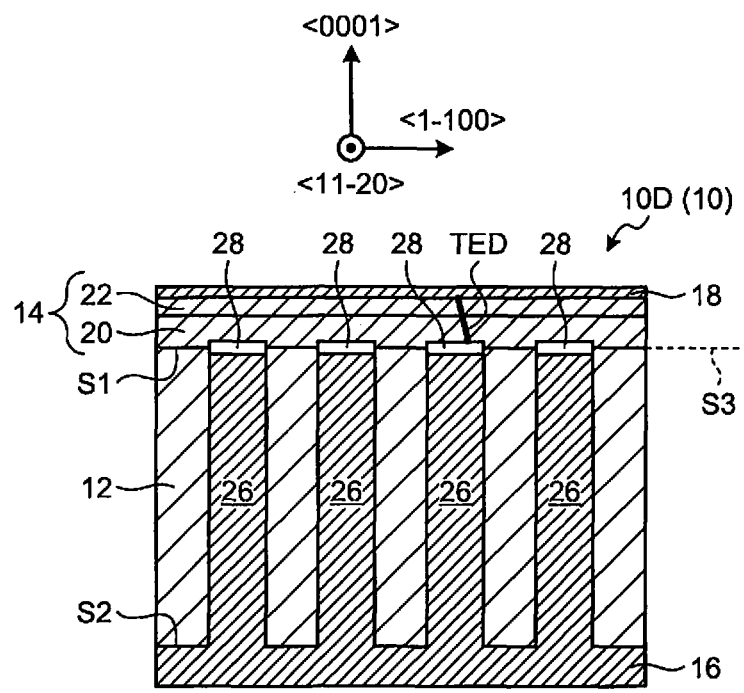
FIG. 11A is a schematic diagram of a semiconductor device 10.

FIG. 11A is a schematic diagram illustrating an example of a semiconductor device 10D according to the present modification. The semiconductor device 10D is an example of the semiconductor device 10. The semiconductor device 10D includes a lower electrode 16, a support substrate 12, a semiconductor film 14, and an upper electrode 18. The support substrate 12 is provided with the trench 26.

In the present modification, a basal surface of the trench 26 is formed with an epitaxial growth film 28. The epitaxial growth film 28 is a layer formed by epitaxially growing a semiconductor material (for example, SiC) in the direction from the upper electrode 18 above an interface S3 toward the second surface S2 of the support substrate 12.

It is sufficient that the basal surface of the trench 26 is positioned closer to the second surface S2 of the support substrate 12 than the interface S3 between the support substrate 12 and the semiconductor film 14 as in the above second embodiment and the above modification. Note that it is sufficient that at least a part of the basal surface of the trench 26 is positioned closer to the second surface S2 of the support substrate 12 than the interface S3. That is, a partial region of the basal surface of the trench 26 may be positioned on a side of the upper electrode 18 above the interface S3.

Figure 11B:
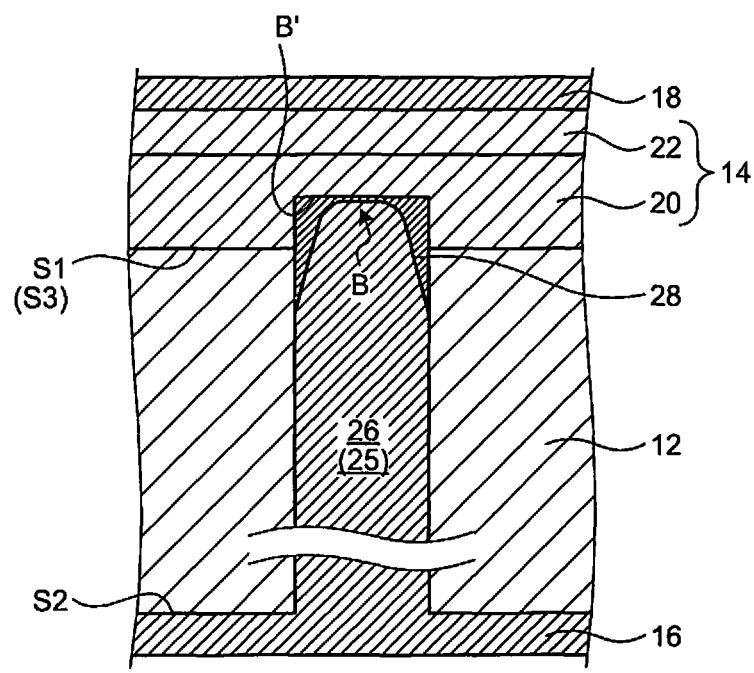
FIG. 11B is an enlarged schematic diagram of the semiconductor device.

FIG. 11B is an enlarged schematic diagram of a region including the basal surface of the trench 26 of the semiconductor device 10D. For example, as illustrated in FIG. 11B, the basal surface B of the trench 26 includes a basal surface B' inside a hole portion 25 formed at the time of manufacturing the trench 26 and an epitaxial growth film 28 epitaxially grown from the basal surface B' in the hole portion 25 toward the second surface S2.

It is sufficient that at least a part of a surface of the epitaxial growth film 28 closer to the second surface S2 is positioned closer to the second surface S2 than the interface S3 and a part thereof may be positioned in the semiconductor film 14 and separate from the interface S3. That is, it is sufficient that the basal surface B of the trench 26 is formed by the basal surface B' inside the hole portion 25 and the epitaxial growth film 28 epitaxially grown on the basal surface B', and at least a part of the basal surface B is positioned closer to the second surface S2 than the interface S3. In other words, a partial region of the basal surface B of the trench 26 may be positioned in the semiconductor film 14 (closer to the upper electrode 18) and separate from the interface S3 between the semiconductor film 14 and the support substrate 12.

Figure 12A:
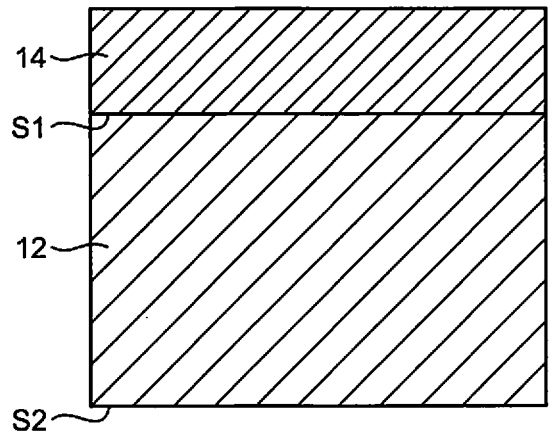
FIG. 12A is an explanatory diagram of a method of manufacturing a semiconductor device.
Figure 12B:
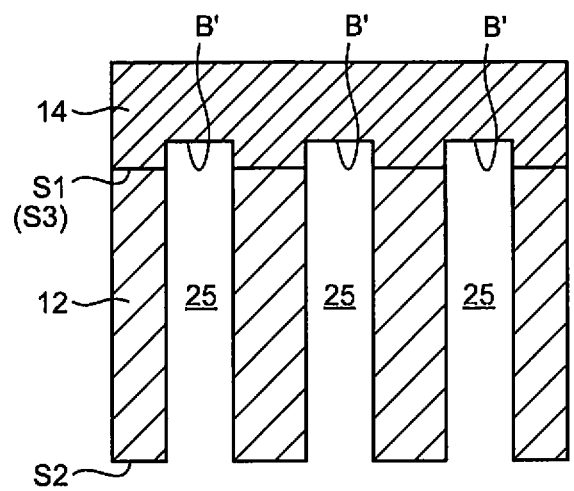
FIG. 12B is an explanatory diagram of the method of manufacturing the semiconductor device.
Figure 12C:
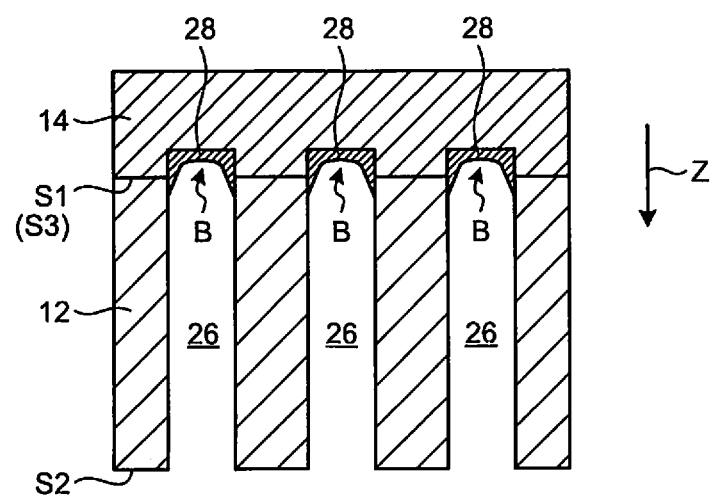
FIG. 12C is an explanatory diagram of the method of manufacturing the semiconductor device.

FIGS. 12A to 12C are explanatory diagrams of a method of manufacturing the semiconductor device 10D according to the present modification.

First, as illustrated in FIG. 12A, the semiconductor film 14 is formed on a first surface S1 of the support substrate 12. A method of forming the semiconductor film 14 is similar to the method in the above embodiment.

Next, as illustrated in FIG. 12B, on the second surface S2 opposite to the first surface S1 of the support substrate 12 on which the semiconductor film 14 is formed on the first surface S1, the hole portion 25 opening on the second surface S2 and having the basal surface B' positioned in the semiconductor film 14 and separate from the interface S3 between the semiconductor film 14 and the support substrate 12 is formed (forming process). Having the basal surface B' positioned in the semiconductor film 14 and separate from the interface S3 means having the basal surface B' in a direction away from the support substrate 12, from the interface S3. Specifically, having the basal surface B' positioned in the semiconductor film 14 and separate from the interface S3 means that the basal surface B' is positioned not in the support substrate 12 but in the semiconductor film 14 (specifically, in an N-type well layer 20).

The hole portion 25 is formed by forming a mask layer such as a silicon oxide film patterned in accordance with a formation region of the trench 26 on the second surface S2 and then etching by RIE, a trench etcher, or the like. At this time, a part of the support substrate 12 and the semiconductor film 14 is etched so that the hole portion 25 penetrates the support substrate 12 and the basal surface B' of the hole portion 25 is positioned in the semiconductor film 14 and separate from the interface S3. Note that the trench 26 may be formed by dicing the support substrate 12 from the second surface S2.

Then, as illustrated in FIGS. 12B and 12C, the semiconductor material (for example, SiC) is epitaxially grown on the basal surface B' of the hole portion 25 from the basal surface B' toward the second surface S2 (see arrow Z) and the epitaxial growth film 28 is formed. For example, the epitaxial growth film 28 is, for example, an $N^+$ SiC film. By the formation of this epitaxial growth film 28, the trench 26 in which at least a part of the basal surface B is positioned closer to the second surface S2 than the interface S3 is formed (growth step).

Then, by forming the lower electrode 16 and the upper electrode 18, the semiconductor device 10D is manufactured (see FIGS. 11A and 11B).

As described above, in the present modification, on the second surface S2 opposite to the first surface S1 of the support substrate 12 on which the semiconductor film 14 is formed on the first surface S1, the hole portion 25 opening on the second surface S2 and having the basal surface positioned in the semiconductor film 14 and separate from the interface S3 between the semiconductor film 14 and the support substrate 12 is formed (forming step).

Here, as described above, a BPD that is the origin of a stacking fault 24 includes a dislocation specifically occurring in the interface S3 (see FIG. 1) between the support substrate 12 and the semiconductor film 14. Therefore, by forming the hole portion 25 reaching the inside of the semiconductor film 14 via the interface S3 between the support substrate 12 and the semiconductor film 14, it is possible to remove the BPD that is the cause of the occurrence of the stacking fault 24. Therefore, it is possible to remove the BPD that is the origin of the occurrence and expansion of the stacking fault 24.

Therefore, in the present modification, it is possible to provide the semiconductor device 10D in which the stacking fault 24 is further suppressed as compared with the above embodiment and modification.

Furthermore, in the present modification, the semiconductor material is epitaxially grown on the basal surface B' of the hole portion 25 from the basal surface B' toward the second surface S2, and the trench 26 in which at least a part of the basal surface B is epitaxially grown from the interface S3 toward the second surface S2 is formed.

The epitaxial growth film 28 that is thin can be formed by epitaxially growing the epitaxial growth film 28 on the basal surface B' of the hole portion 25.

Third Modification

Note that a cross-sectional shape of a cross-section of a trench 26 cut along a (0001) plane of a support substrate 12 is not limited.

Figure 13A:
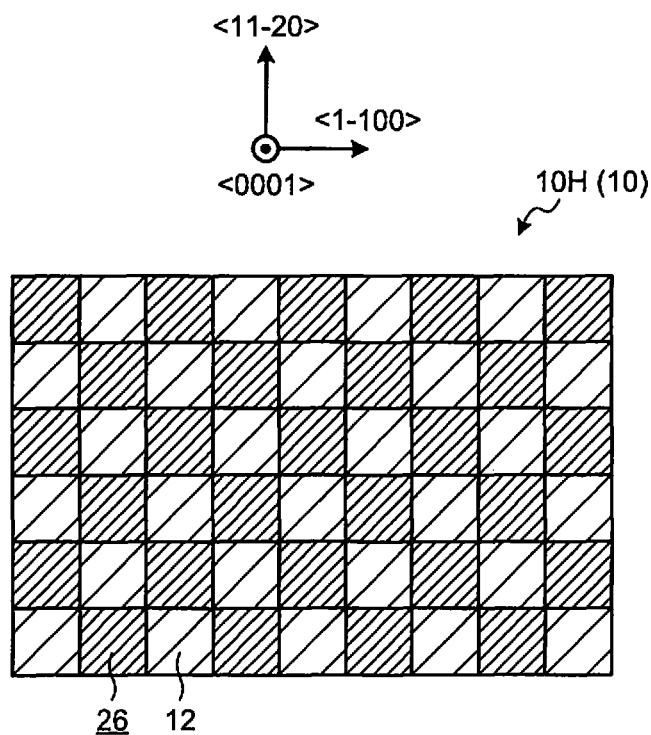
FIG. 13A is a schematic diagram of a semiconductor device.
Figure 13B:
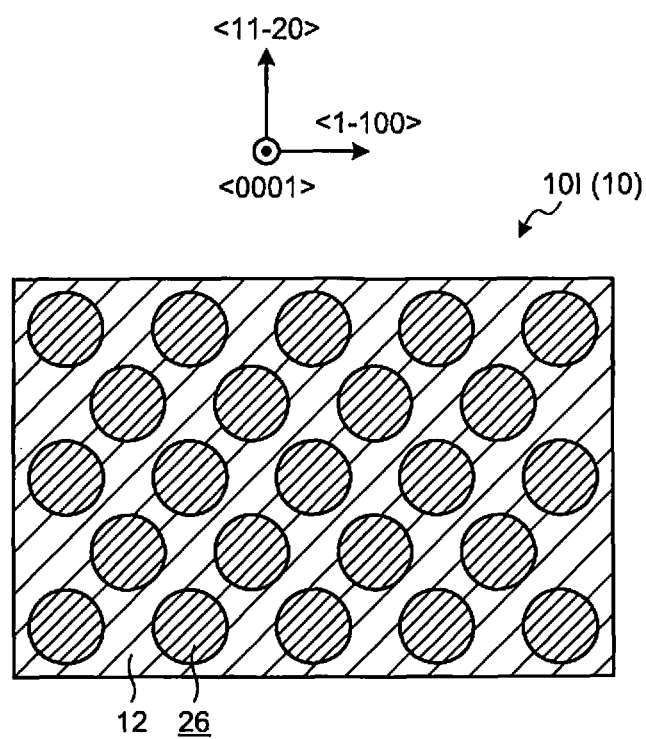
FIG. 13B is a schematic diagram of a semiconductor device.

FIGS. 13A and 13B are schematic diagrams each illustrating an example of a semiconductor device 10 (semiconductor device 10H and semiconductor device 10I).

For example, as illustrated in FIG. 13A, the semiconductor device 10H in which trenches 26 are arranged in a lattice form on the support substrate 12 may be used. Furthermore, as illustrated in FIG. 13B, the semiconductor device 10I in which a plurality of trenches 26 having a circular cross-sectional shape cut along a (0001) plane of a support substrate 12 is arranged along a second surface S2 may be used.

Note that the cross-sectional shape of the cross-section of the trench 26 cut along the (0001) plane of the support substrate may be a polygonal shape such as a hexagonal shape.

Note that the semiconductor devices described in the embodiments and the modifications can be applied to any types of devices in which the stacking fault 24 occurs. For example, in the above embodiments and modifications, a case where SiC is used as the support substrate 12 has been described. However, GaN and GaAS may be used for the support substrate 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a support substrate;
   a semiconductor film provided on a first surface of the support substrate;
   a lower electrode provided on a second surface of the support substrate that is opposite to the first surface; and
   an upper electrode provided on a surface opposite to a surface contacting the support substrate in the semiconductor film,
   wherein
   the support substrate includes a trench opening on the second surface and extending from the second surface toward the semiconductor film,
   the trench includes a plurality of trenches arrayed at an interval along the second surface and the interval is less than a length of the expansion direction of a stacking fault, and
   a total value of: a change amount of chemical potential of the semiconductor device with respect to an expansion direction of the stacking fault, and stacking fault energy of the stacking fault, is zero or more.

2. The device according to claim 1, wherein a partial region of a basal surface inside the trench is positioned in the semiconductor film and separate from an interface between the semiconductor film and the support substrate.

3. The device according to claim 1, wherein the trench is filled with the lower electrode.

4. A semiconductor device, comprising:
a support substrate;
a semiconductor film provided on a first surface of the support substrate;
a lower electrode provided on a second surface of the support substrate that is opposite to the first surface; and
an upper electrode provided on a surface opposite to a surface contacting the support substrate in the semiconductor film,
wherein
the support substrate includes a trench opening on the second surface and extending from the second surface toward the semiconductor film,
the trench is arranged to extend in a direction along the second surface and the direction in which the trench extends is a direction crossing the expansion direction of a stacking fault, and
a total value of: a change amount of chemical potential of the semiconductor device with respect to an expansion direction of the stacking fault, and stacking fault energy of the stacking fault, is zero or more.

5. The device according to claim 4, wherein a partial region of a basal surface inside the trench is positioned in the semiconductor film and separate from an interface between the semiconductor film and the support substrate.

6. The device according to claim 4, wherein the trench is filled with the lower electrode.

7. A semiconductor device comprising:
a support substrate;
a semiconductor film provided on a first surface of the support substrate;
a lower electrode provided on a second surface of the support substrate that is opposite to the first surface; and
an upper electrode provided on a surface opposite to a surface contacting the support substrate in the semiconductor film, wherein
an impurity concentration or a thickness of the support substrate or the semiconductor film satisfies a condition that a total value of: a change amount of chemical potential of the semiconductor device with respect to an expansion direction of a stacking fault, and stacking fault energy of the stacking fault, is zero or more, and
the chemical potential of the semiconductor device represents a sum of respective chemical potentials of the support substrate and the semiconductor film.

* * * * *